United States Patent
Schulz-Linkholt et al.

(10) Patent No.: US 11,736,101 B2
(45) Date of Patent: Aug. 22, 2023

(54) DRIVER FOR POWER DISTRIBUTION SWITCH

(71) Applicant: Infineon Technologies AG, Neubiberg (DE)

(72) Inventors: Christoph Schulz-Linkholt, Neubiberg (DE); Michael Asam, Inchenhofen-Sainbach (DE); Andre Mourrier, Manosque (FR)

(73) Assignee: Infineon Technologies AG, Neubiberg (DE)

( * ) Notice: Subject to any disclaimer, the term of this patent is extended or adjusted under 35 U.S.C. 154(b) by 109 days.

(21) Appl. No.: 17/167,848

(22) Filed: Feb. 4, 2021

(65) Prior Publication Data
US 2021/0297071 A1 Sep. 23, 2021

(30) Foreign Application Priority Data
Mar. 19, 2020 (DE) .......................... 102020107577.4

(51) Int. Cl.
| | |
|---|---|
| *H03K 17/082* | (2006.01) |
| *G06F 11/07* | (2006.01) |
| *G05F 1/573* | (2006.01) |
| *G05F 1/567* | (2006.01) |
| *H03K 17/18* | (2006.01) |

(52) U.S. Cl.
CPC ......... *H03K 17/0822* (2013.01); *G05F 1/567* (2013.01); *G05F 1/573* (2013.01); *G06F 11/0757* (2013.01); *H03K 17/18* (2013.01)

(58) Field of Classification Search
None
See application file for complete search history.

(56) References Cited

U.S. PATENT DOCUMENTS

| | | | |
|---|---|---|---|
| 6,985,343 B2* | 1/2006 | Mirowski | G06F 1/28 361/93.2 |
| 8,294,429 B2* | 10/2012 | Fuller | H02P 9/305 323/283 |

(Continued)

FOREIGN PATENT DOCUMENTS

| | | |
|---|---|---|
| DE | 102007008387 A1 | 8/2008 |
| DE | 102012216558 A1 | 3/2013 |

OTHER PUBLICATIONS

Office Action, in the German language, from counterpart German Application No. 102020107577.4, dated Nov. 11, 2020, 7 pp.

*Primary Examiner* — Thomas J. Hiltunen
(74) *Attorney, Agent, or Firm* — Shumaker & Sieffert, P.A.

(57) ABSTRACT

A circuit for controlling electrical power is described herein. In accordance with one embodiment, the circuit comprises: a circuit node operably connected to a pass element configured to be switched on and off in accordance with a drive signal applied at the circuit node; a communication interface configured to receive data from an external controller operably connected to the communication interface; and a control circuit configured to generate, in a first mode of operation, the drive signal dependent on parameters of a first parameter set and based on data received via the communication interface, and to generate, in a second mode of operation, the drive signal dependent on parameters of a second parameter set while discarding data received via the communication interface.

15 Claims, 3 Drawing Sheets

(56) References Cited

U.S. PATENT DOCUMENTS

| | | | | |
|---|---|---|---|---|
| 8,488,283 B2* | 7/2013 | Ando | ............... | H02H 9/025 |
| | | | | 361/18 |
| 9,030,054 B2* | 5/2015 | Jacobson | ............... | H02M 1/08 |
| | | | | 307/115 |
| 9,270,111 B2* | 2/2016 | Ando | ............... | H03K 17/166 |
| 10,476,494 B2* | 11/2019 | Suh | ............... | H02H 6/00 |
| 10,477,626 B2* | 11/2019 | Tran | ............... | H03K 5/19 |
| 10,511,291 B1* | 12/2019 | Kandah | ............... | H03K 17/567 |
| 2013/0069612 A1 | 3/2013 | Feldtkeller | | |
| 2014/0368240 A1 | 12/2014 | Shelton et al. | | |
| 2018/0331682 A1* | 11/2018 | Duduman | ............... | H02M 1/38 |
| 2021/0028781 A1* | 1/2021 | Mayer | ............... | H03K 17/0828 |
| 2022/0139557 A1* | 5/2022 | Shrestha | ............... | A61B 5/7246 |
| | | | | 705/2 |

* cited by examiner

DRIVER FOR POWER DISTRIBUTION SWITCH

This application claims priority to German Application Number 102020107577.4, filed Mar. 19, 2020, the entire content of which is incorporated herein by reference.

TECHNICAL FIELD

The present disclosure relates to circuits for driving electronic switches, in particular for safety critical applications.

BACKGROUND

Electronic switches are increasingly used in a large variety of applications. For example, the on-board energy supply of a car can be regarded as a (power supply) network for distributing electrical energy to various electric loads via a plurality of electronic switches. The energy supply network may be composed of several subnetworks which may be coupled via electronic switches. Further, individual loads (within a subnetwork) may also be supplied via electronic switches. In this regard, electronic switches may fulfill several purposes. Individual loads or subnetworks may be intentionally switched off when they are not needed in order to avoid high standby currents that might discharge the automotive battery. Further, electronic switches may be used to replace classical fuses to protect a wire or a whole subnetwork from over-currents due to short-circuits or other electrical failures.

In many applications switching off an electrical load or a subnetwork may be a suitable emergency measure and reaction to a detected failure that is potentially dangerous. However, in applications such as in automatedly driven cars or in advanced driving assistance systems ADAS, certain safety-related standards (e.g. ISO 26262) have to be adhered to; and these standards require the electric load or the subnetwork to remain functional at least for a specific time. That is, it may be important that safety-critical electric loads or subnetworks (e.g. radar sensors, automatic steering system, etc.) are permanently supplied with electrical energy even in case of an malfunction of one or more components. In other words, a "fail-operational" system design is one design goal for on-board energy supply networks.

Electronic switches are composed of a transistor (e.g. MOS Fields Effect Transistors, Insulated Gate Bipolar Transistors, etc.) and respective control circuits. In this context, the transistors are not necessarily used as on/off switches but they can also be operated as current regulators, voltage regulators, electronic fuses or the like, depending on the specific function of the control circuit. The power transistors and the respective control circuits may be integrated in the same semiconductor die or in separate semiconductor dies.

Electronic switches and in particular their control circuits usually receive input signals from superordinate controllers such as micro-controllers or the like that may execute application-specific software (firmware). The communication between the control circuit of an electronic switch and the superordinate controllers can be a single point of failure. As discussed above, single points of failure may be undesired in a system design that aims at remaining functional (i.e. fail operational) in case of a malfunction of one or more components. Usually single points of failure are avoided using redundancy, which increases costs and reduces electrical efficiency. Accordingly, there is a need for improvement of currently known electronic switches and particularly their control circuits.

SUMMARY

A circuit for controlling electrical power is described herein. In accordance with one embodiment, the circuit comprises: a circuit node operably connected to a pass element configured to be switched on and off in accordance with a drive signal applied at the circuit node; a communication interface configured to receive data from an external controller operably connected to the communication interface; and a control circuit configured to generate, in a first mode of operation, the drive signal dependent on parameters of a first parameter set and based on data received via the communication interface, and to generate, in a second mode of operation, the drive signal dependent on parameters of a second parameter set while discarding data received via the communication interface.

Further, a method for operating a semiconductor device is described herein. In accordance with one embodiment, the method comprises: receiving data using a communication interface of a semiconductor device and from an external controller operably connected to the semiconductor device; generating, with a control circuit of the semiconductor device and in a first mode of operation, a drive signal for a pass element dependent on parameters of a first parameter set and based on data received via the communication interface; the pass element being included in or coupled to the semiconductor device; and generating—with the control circuit and in a second mode of operation—the drive signal dependent on parameters of a second parameter set while discarding data received via the communication interface.

BRIEF DESCRIPTION OF THE DRAWINGS

The invention can be better understood with reference to the following drawings and descriptions. The components in the figures are not necessarily to scale; instead emphasis is placed upon illustrating the principles of the invention. Moreover, in the figures, like reference numerals designate corresponding parts. In the drawings.

DETAILED DESCRIPTION

Figure 1:
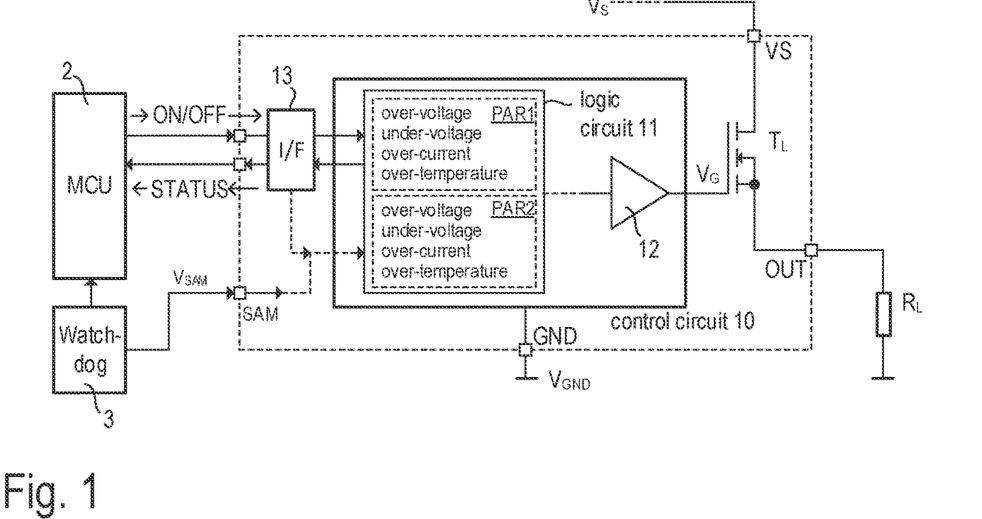
FIG. 1 illustrates a first example of an electronic switch composed of a power transistor and a control circuit, wherein the control circuit can communicate with a superordinate controller.

FIG. 1 illustrates a first example of an electronic switch 1 composed of a power transistor $T_L$ and a control circuit 10, wherein the control circuit 10 is coupled to a communication interface 13 for communicating with a superordinate controller 2. In the depicted example, the power transistor $T_L$, control circuit 10, and communication interface 13 are integrated in a single semiconductor die, which is often referred to as "smart switch" or "intelligent semiconductor switch". It is understood, however, that, in some embodiments, power transistor $T_L$ and control circuit 10 are implemented in separate semiconductor dies included in separate chip packages.

Moreover, in the depicted example, the power transistor $T_L$ is operated as a high-side switch. That is, the power transistor $T_L$ is coupled between a supply node providing a positive supply voltage Vs and the electric load to be supplied. It is understood, that, in some embodiments, the power transistor $T_L$ may be operated as a low-side switch. In this case, the power transistor $T_L$ is coupled between a circuit node providing a reference voltage $V_{GND}$ (e.g. ground node at ground potential) and the electric load to be supplied. The examples and concepts described herein are not limited to transistors in high-side configuration and can be readily applied to low-side transistors as well. Furthermore, it is noted that the power transistor $T_L$ is not necessarily used as an on/off switch. In some embodiments, the power transistor may also be employed for load current regulation or output voltage regulation. The respective regulator circuit may be included in the control circuit 10 although not explicitly shown in FIG. 1. In this description, transistors are generally referred to as controllable pass elements irrespective of their application as switch, current or voltage regulator, electronic fuse, or the like.

According to FIG. 1, the control circuit 10 is configured to provide a drive signal $V_G$ for the power transistor $T_L$. The drive signal $V_G$ is a gate voltage in embodiments in which the power transistor is implemented as a MOS transistor. The gate voltage $V_G$ applied to the power transistor's gate controls the conduction state of the power transistor. In the present example, the drive signal $V_G$ is provided by the gate driver 12 included in the control circuit 10. It is noted that implementation and function of gate drivers are well known and are thus not further discussed herein.

In the present example, the gate driver 12 generates the drive signal $V_G$ in accordance with a control signal $V_{ON}$, which may be a binary signal and be provided by a logic circuit 11, which is also included in the control circuit 10. It is noted that the control signal $V_{ON}$ may be a binary signal in applications in which the power transistor $T_L$ is basically configured for an on/off switching. In other applications, in which the transistor may be used for current or voltage regulation, the control signal $V_{ON}$ may be an continuous signal over a defined voltage (or current) range. In this case a more complex regulator circuit would be needed instead of logic circuit 11. In some applications, the control signal $V_{ON}$ may be a modulated signal such as a PWM (pulse-width modulated) signal.

In the present example of FIG. 1, the logic circuit 11 is configured to communicate with a superordinate controller 2 via communication interface 13, which may also be part of the control circuit. The superordinate controller 2 may be a microcontroller which is configured to execute software instructions and whose function is mainly determined by software (often also referred to as firmware). The communication interface 13 may be a digital communication interface such as a Serial Peripheral Interface (SPI), which is commonly used in connection with microcontrollers. However, any other communication interface is also applicable ($I^2C$ interface, Local Interconnect Bus, parallel interface, etc.). The control circuit 10, and particularly the logic circuit 11, may be configured to receive commands and further data from the microcontroller 2 via the communication interface and to generate the control signal $V_{ON}$ for the gate driver 12 based on and in response to one or more specific commends and (optionally) further data received via the communication interface. In one simple embodiment, the commands received from the microcontroller may be switch-on commands and switch-off commands that cause the control logic 11 to generate a control signal $V_{ON}$ suitable to switch the transistor $T_L$ on or off.

When generating the control signal $V_{ON}$, the logic circuit 11 may consider one or more parameters of a parameter set. For example, when the logic circuit 11 receives a switch-on command via the communication interface, it may generate a respective control signal $V_{ON}$. However, the control signal $V_{ON}$ may further depend on one or more parameters of the mentioned parameter set, wherein the parameter set may include parameters such as an over-voltage-threshold, an under-voltage threshold, an over-current threshold, an over-temperature threshold, a parameter representing a desired slew rate, etc. These parameters may be set, for example, by the microcontroller 2. That is, the control circuit receives data representing the parameters via the communication interface and stores the received parameters in a (e.g. non-volatile) memory. The parameter set (see FIG. 1, parameter sets PAR1, PAR2) used may depend on a current mode of operation, as will be explained further below.

As explained above, the control circuit 10 generates the drive signal $V_G$ for the power transistor $T_L$ based on and in response to commands and data received from the microcontroller 2, whose function depends on software. It is evident that the software-controlled communication between microcontroller 2 and the control circuit 10 is safety critical. As discussed above, the overall system should be designed such that it remains function even in the case of a failure of one or more components. Complex, software-controlled sub-systems such as the microcontroller 2 are considered potentially error-prone and thus safety measures need to be provided in case the microcontroller 2 fails or exhibits some undesired/erroneous behavior.

One known safety measure is using a so-called watchdog circuit, which is configured to continuously test whether another monitored circuit is still operative. In the example of FIG. 1, watchdog circuit 3 is configured to continuously surveil the microcontroller by testing whether the microcontroller 2 is operative and to signal if this is not the case. For example, the watchdog 3 may send a test signal to the microcontroller 2 and wait for a specific response signal from the microcontroller 2. In the event that the watchdog 3 does not receive a correct response signal from the microcontroller, it generates an alarm signal $V_{SAM}$ which signals a malfunction of the microcontroller 2. Implementation, function and use of a watchdog circuit are as such known and thus not further discussed herein. In the example of FIG. 1 the watchdog circuit 3 may be a dedicated integrated circuit (in its own chip package) separate from the microcontroller 2 and the electronic switch 1. In another embodiment, the watchdog circuit 3 may be integrated in the same semiconductor die as the control circuit 10. In some embodiments, two watchdog circuits may be used to provide some redundancy; an external watchdog circuit 3 and an further watchdog circuit integrated in the same semiconductor die as the control circuit 10 (see FIG. 3, watchdog circuit 15).

As mentioned above, the control circuit 10 may be configured to operate in two or more different modes of operation, wherein in a first mode—referred to as normal mode—a first parameter set PAR1 is used when generating the control signal $V_{ON}$ and the respective drive signal $V_G$. As discussed above, the first parameter set PAR1 may include one or more parameters (such as, e.g., over-current threshold, over-temperature threshold, etc.) which are considered (i.e. which are processed) when the control signal $V_{ON}$ is generated and which thus potentially (i.e. in specific situations) affect the control signal $V_{ON}$. In normal mode, the electronic switch (particularly the control circuit 10) is responsive to data received via the communication interface 13. That is, the generation of the drive signal $V_G$ may depend on the received data, which may include control commands for controlling the state of the electronic switch.

In the embodiments described herein, the control circuit 10 can also operate in a second mode of operation, which is hereinafter referred to as SAM (Safe Availability Mode). In the second mode of operation (i.e. in SAM) the control circuit uses a second parameter set PAR2 which includes parameter values different from the first parameter set PAR1 used in the normal mode. It is noted that the parameter sets PAR1 and PAR2 do not necessarily differ in all parameter values. However, one or more parameters of parameter set PAR2 have values that are different from those of the corresponding parameters in parameter set PAR1. Both parameter sets may be stored in a (e.g. non-volatile) memory included in the control circuit 10.

While operating in the second mode of operation, any data received via the communication interface 13 is discarded (e.g. ignored or blocked) by the communication interface. As will be explained in detail further below, the second mode of operation (SAM) will, in essence, only be active when the superordinate controller 2 fails or exhibits some unusual/unexpected behavior. To remain functional at least for some time, it may be important for some applications that, in situations in which the microcontroller 2 exhibits an unpredictable behavior, the proper operation of the electronic switch is not jeopardized by faulty data received via the communication interface 13. Discarding/ignoring received data in the second mode of operation while maintaining the state of the transistor $T_L$ (based on modified parameters, as the second parameter set PAR2 is used) may contribute to increasing functional safety of the overall system (i.e. to remaining operational despite of a failure of one or more components). In one embodiment, the reception of data can be blocked in the communication interface by setting, for example, a lock-bit which, when set, prevents the registers that hold the received data from being modified.

A changeover to the second mode may be triggered by detection of one or more conditions. The semiconductor chip that includes the control circuit 10 may have a dedicated chip pin, which is also labelled SAM in the drawings and further referred to as SAM pin. A changeover may be triggered upon detection of a specific signal level (e.g. a high level) of a mode-switch signal received at the SAM pin (first condition). In the examples described herein, the alarm signal $V_{SAM}$, which is generated by the watchdog circuit 3 in response to detecting that the microcontroller is non-responsive, is supplied to the SAM pin, wherein a high level of the signal $V_{SAM}$ may indicate a non-responsive microcontroller. Accordingly, a changeover to the second mode (SAM) is triggered by the watchdog circuit 3 by generating the signal $V_{SAM}$ with a signal level that indicates that the microcontroller is non-responsive.

Further, the communication interface 13 may trigger a changeover to the second mode (SAM) upon detecting that data received from the microcontroller 2 is corrupted (second condition) and signal the detection of corrupted data to the control circuit 10. For example, the data words or data frames sent by the microcontroller may include redundant data that allows detection of faulty data. Such redundant data may be, e.g., parity bit(s), bits generated by Cyclic Redundancy Check (CRC), etc. Additionally or alternatively, the control circuit 10 may detect unusual or unexpected behavior of the microcontroller based on the content of the received data (although the data transmission may be error-free). In this case, the received data may also be classified as corrupted. For example, if the received data does not make sense and thus cannot be processed by the control circuit 10, the received data may be classified as corrupt with the consequence that a changeover to the second mode (SAM) is triggered. It is noted that a single occurrence of corrupted data does usually not lead to a changeover into the second mode. However, if the control circuit receives (via the communication interface 13) corrupted data repeatedly (e.g. for a specific time span), then the changeover to the second mode may be triggered.

Optionally, the semiconductor chip that includes the control circuit 10 may also include a further (internal) watchdog circuit for monitoring the microcontroller 2. This internal watchdog may signal to the control circuit 10 when the microcontroller 3 is non-responsive (third condition) and the control circuit 10 may trigger a changeover to the second mode in response thereto. The function of the internal watchdog circuit will be further explained further below with reference to FIG. 3. It is noted that it is sufficient for only one of the mentioned conditions to be satisfied to trigger a changeover into the second mode (SAM).

In some embodiments, the control circuit 10 is configured to inform the microcontroller of its operation in the second mode. For example, the control circuit 10 may repeatedly send, via the communication interface 13, status messages (e.g. a specific data word or data frame) to the microcontroller indicating that the second mode (SAM) is active. If, for example, the microcontroller 2 is restarted after a malfunction, it can receive the status messages and respond thereto.

According to some embodiments, when operating in the second mode (SAM), the control circuit 10 may change back to the normal mode when the following two conditions are cumulatively fulfilled. First, data including a mode switch-command is received from the microcontroller 2 via the communication interface 13 and, second, the mode-switch signal $V_{SAM}$ at the SAM pin has a level indicating a mode switch into the normal mode. In order to make this happen, the watchdog circuit 3 must determine that the microcontroller 2 is (again) responsive and generate the signal $V_{SAM}$ with a respective signal level (e.g. a low level). Furthermore, the microcontroller 2 must be functional and capable of receiving the above-mentioned status message (informing the microcontroller that the control circuit 10 is operating in SAM) and sending a mode-switch command to the control circuit 10 in order to instruct the control circuit to resume operation in normal mode.

Figure 2:
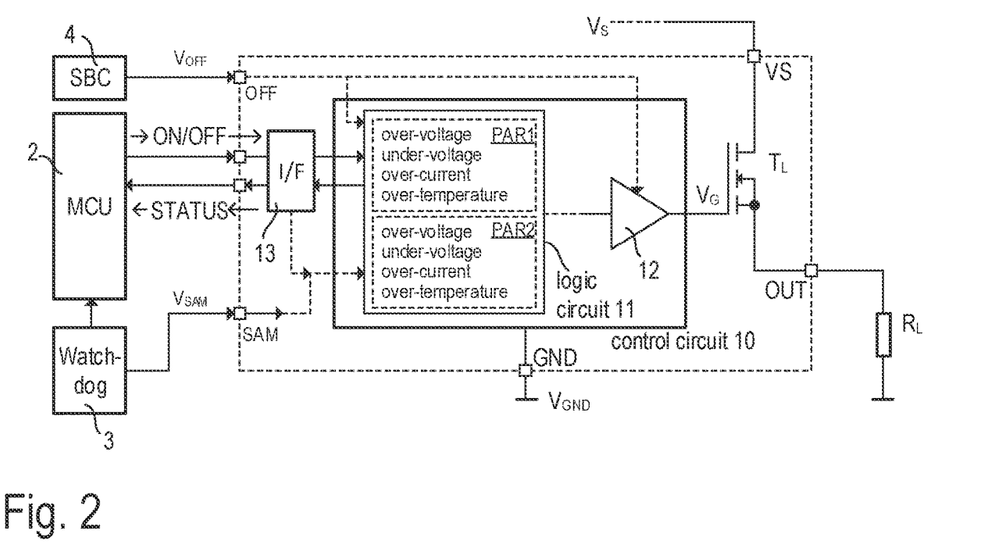
FIGS. 2-4 illustrate further examples of electronic switches composed of a power transistor and a control circuit, which can be seen as modifications/enhancements of the example of FIG. 1.
Figure 3:
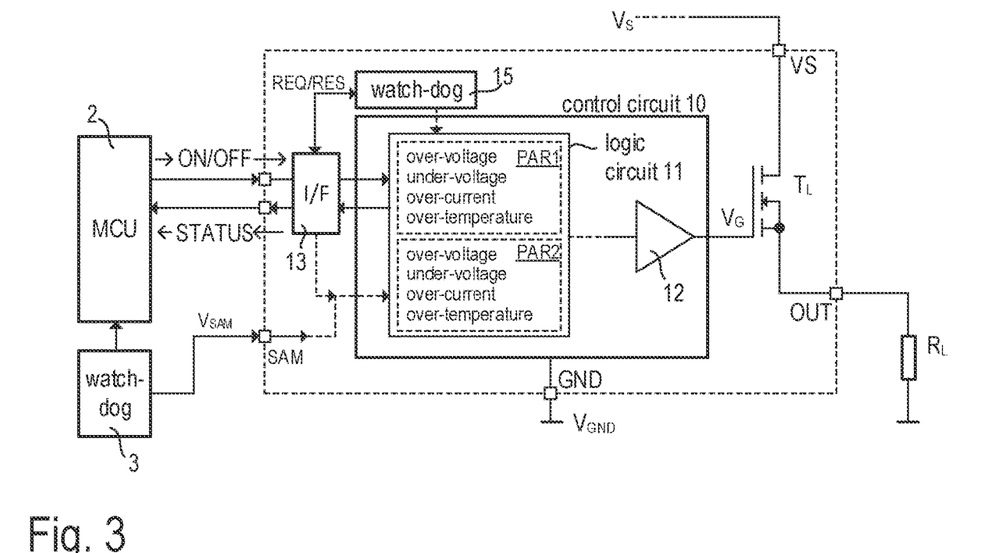
Figure 4:
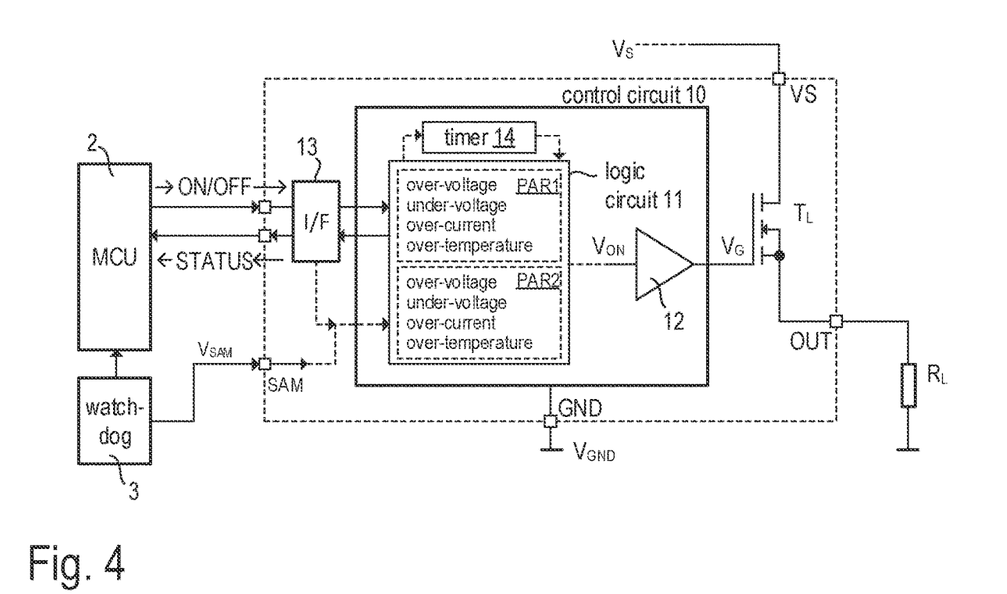

FIGS. 2-4 illustrate embodiments which are modifications and further developments of the embodiment of FIG. 1. For the most part, the embodiments are identical, so that in the following description emphasis is placed on the additional features of the embodiments of FIG. 2-4 that are not shown in FIG. 1. It is understood that the additional features illustrated in FIGS. 2-4 can be combined to create further embodiments.

In some embodiments, the control circuit may be configured to operate in a third mode of operation, which is also referred to as safe-state mode. Upon entering the safe-state mode the control circuit 10 generates a control signal $V_{ON}$ with a signal level that causes the gate driver 12 to output a drive signal $V_G$ (gate voltage) suitable to switch the power transistor $T_L$ off. That is, the power transistor $T_L$ is switched off during a changeover into safe-state mode and remains off during safe-state mode. Generally, the transistor being switched off means that the transistor is in a non-conductive state, whereas being switched on means that the transistor is in a conductive state. Dependent on the application "safe state" may also refer to a situation, in which the power transistor $T_L$ is safely switched on. In some embodiments, the safe-state mode is characterized by bypassing the logic-circuit and directly enabling or disabling the gate-driver circuit 12 without interjacent (complex and potentially error-prone) logic circuits. As shown in FIG. 4, the signal $V_{OFF}$ (received at pin OFF) directly affects the gate of the transistor $T_L$ (e.g. by deactivating the output-stage of the gate driver 12) and the logic circuit 11 is bypassed.

A changeover to safe-state mode may be triggered dependent on different conditions being fulfilled. First, the semiconductor chip, which includes the control circuit 10, may have a dedicated pin (e.g. solder pin, solder ball or the like) configured to receive a mode-switch signal from an external device. In FIG. 2, this pin is labelled OFF and the mode-switch signal supplied to this OFF pin is denoted as $V_{OFF}$. The mode-switch signal $V_{OFF}$ may be a binary signal and a low-level of the mode-switch signal $V_{OFF}$ may cause the control circuit 10 to change to safe-state mode. In the example of FIG. 2, the mode-switch signal $V_{OFF}$ is generated by a System Basis Chip (SBC) 4. However, the mode-switch signal $V_{OFF}$ may be generated by any other suitable external device. It is noted that the system basis chip 4 may also include the watchdog circuit 3 in some embodiments.

FIG. 3 illustrates a further example, in which the semiconductor chip that includes the control circuit also includes a further (internal) watchdog circuit 15). The internal watchdog 15 is configured to regularly send, via the communication interface 13, a data word or data frame with a message to the microcontroller 2 and to receive respective response messages from the microcontroller 2. If the watchdog circuit 15 determines that the microcontroller 2 is non-responsive, the control circuit 10 is informed accordingly by a suitable signal and the control circuit may change to the second mode (SAM) as explained in detail above.

In the example illustrated in FIG. 4 the control circuit 10 includes a timer 14. The timer is used to trigger a change from the second mode (SAM) to the third mode (safe-state) of operation. That is, a changeover to the safe-state mode is triggered in response to the timer 14 indicating that a predefined time span has lapsed since entering the second mode of operation. In other words, the predefined time span determines the time available for resolving the problem that caused the changeover to the second mode (SAM). If the problem is not resolved within the predefined time span (e.g. by restarting the microcontroller and changing back to normal mode), then the control mode continues operation in safe-state mode and switch-off the transistor $T_L$.

As mentioned, the parameter sets PAR1 and PAR2 may be stored in a memory included in the control circuit 10. In some embodiments the control circuit 10 may include a non-volatile memory and an additional volatile memory, wherein the parameter set which is used in the current mode of operation is loaded from the non-volatile memory into the volatile memory when entering a specific mode of operation. The control circuit 10 (and particularly the logic circuit 11 included therein) may be configured to check (e.g. regularly or from time to time) whether the parameter set stored in the volatile memory is consistent with a corresponding parameter set stored in the non-volatile memory and to correct the parameter set stored in the volatile memory when an inconsistency is detected. This feature may further improve robustness of the overall system.

Figure 5:
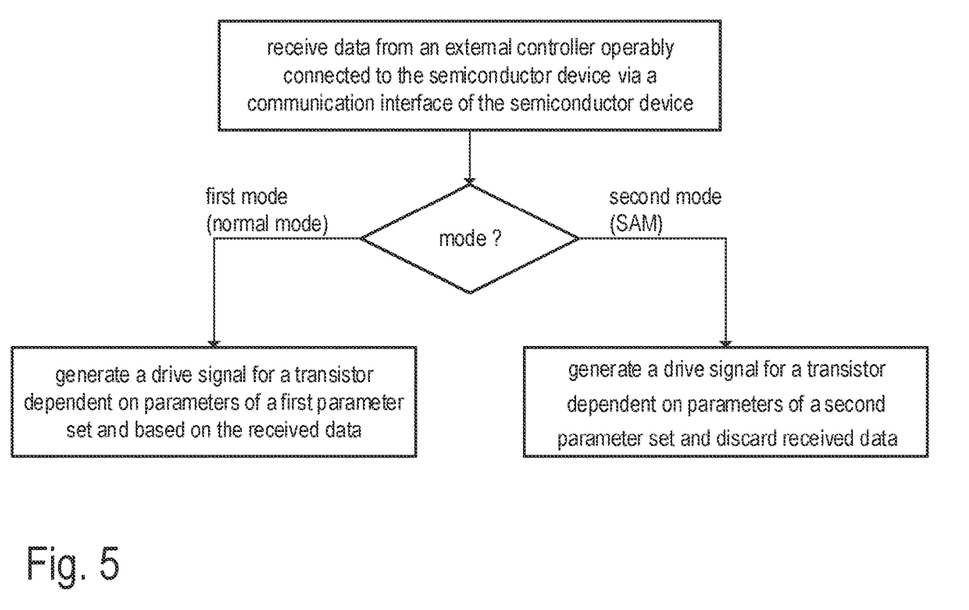
FIG. 5 is a flow chart illustrating one embodiment of a method performed by an electronic switch.

FIG. 5 is a flow chart illustrating an example of a method implemented by the electronic switches described above. As mentioned, the electronic switch may be built as a single semiconductor chip including the control circuit 10, communication interface 13 gate-driver and the power transistor $T_L$ or, alternatively, the circuits forming the semiconductor device may be integrated in difference semiconductor chips. For example, the power transistor $T_L$ may be integrated in one semiconductor chip and the remaining circuitry (control circuit 10, communication interface 13, etc.) may be integrated in another semiconductor chip. According to FIG. 5, the method includes receiving data, using a communication interface of a semiconductor device (e.g. also including the control circuit), from an external controller, which is—at least during operation—connected to the semiconductor device (see FIG. 5, step S1). The further steps depend on the mode of operation, wherein at least two modes of operation are provided. In the first mode of operation (normal mode) the control circuit of the semiconductor device generates a drive signal for the power transistor dependent on parameters of a first parameter set (see FIGS. 1-4, PAR1) and based on data received via the communication interface. In the second mode of operation (SAM) the control circuit of the semiconductor device generates the drive signal for the power transistor dependent on parameters of a second parameter set (see FIGS. 1-4, PAR2) while the data received via the communication interface is discarded/ignored. The transistor $T_L$ may be included in the semiconductor device (single chip solution, also referred to as smart switch) or coupled to the semiconductor device (transistor integrated in a separate chip). The conditions for a mode switch have been discussed in detail above with reference to FIGS. 1-4 and are thus not reiterated here.

The following clauses may demonstrate one or more aspects of the disclosure.

Clause 1—A circuit for controlling electrical power comprising: a circuit node operably connected to a pass element ($T_L$) configured to be switched on and off in accordance with a drive signal ($V_G$) applied at the circuit node; a communication interface (13) configured to receive data from an external controller (2) operably connected to the communication interface; and a control circuit (10) configured to: generate, in a first mode of operation, the drive signal ($V_G$) dependent on parameters of a first parameter set (PAR1) and based on data received via the communication interface (13); and generate, in a second mode of operation, the drive signal ($V_G$) dependent on parameters of a second parameter set (PAR2) while discarding data received via the communication interface (13).

Clause 2—The circuit of clause 1, wherein the control circuit (10) is configured to change from the first mode of operation to the second mode of operation in response to at least one of the following: detecting a mode switch signal ($V_{SAM}$) at a first input pin indicating a mode switch into the second mode of operation; and/or the communication interface (13) detecting received data as being corrupted.

Clause 3—The circuit of clause 2, wherein the control circuit (10) is configured to change from the second mode of operation back to the first mode of operation in response to both: receiving data via the communication interface (13) including a mode switch command; and detecting a mode switch signal ($V_{SAM}$) at the first input pin of the circuit indicating a mode switch into the first mode of operation.

Clause 4—The circuit of any of clauses 1 to 3, further comprising: a watchdog circuit configured to surveil the external controller by requesting response from the external controller (2) and receiving the requested response.

Clause 5—The circuit of clause 4, wherein the control circuit (10) is further configured to change from the first mode of operation to the second mode of operation in response to the watchdog circuit signaling that the external controller is non-responsive.

Clause 6—The circuit of any of clauses 1 to 5, wherein the control circuit (10) is configured to communicate, via the communication interface (13) to the external controller (2), a changeover to the second mode of operation.

Clause 7—The circuit of any of clauses 1 to 6, further comprising: a timer configured to measure the time the circuit operates in the second mode of operation.

Clause 8—The circuit of clause 7, wherein the control circuit (10) is configured to change from the second mode of operation to the third mode of operation in response to the timer indicating that a predefined time span has lapsed since entering the second mode of operation, and wherein the control circuit (10) is further configured to generate the drive signal ($V_G$) with a level suitable to switch the pass element ($T_L$) into a non-conductive state when changing to the third mode of operation.

Clause 9—The circuit of any of clauses 1 to 8, wherein the control circuit (10) is configured to change from the second mode of operation to the third mode of operation in response to receiving, from an external device, a further mode switch signal indicating a mode switch into the third mode of operation; and wherein the control circuit (10) is further configured to generate the drive signal ($V_G$) with a level suitable to switch the pass element ($T_L$) off when changing to the third mode of operation.

Clause 10—The circuit of clause 9, wherein the further mode switch signal is received at a second input pin of the circuit.

Clause 11. The circuit of any of clauses 1 to 10, wherein the control circuit includes a non-volatile memory, in which the a first parameter set (PAR1) and the a second parameter set (PAR2) are stored.

Clause 12—The circuit of clause 11, wherein the control circuit (10) includes a volatile memory including a currently used parameter set, and wherein the control circuit (10) is configured to check whether the parameter set stored in the volatile memory is consistent with a corresponding parameter set stored in the non-volatile memory and to correct the parameter set stored in the volatile memory when an inconsistency is detected.

Clause 13—A method comprising: receiving data, using a communication interface of a semiconductor device and from an external controller (2) operably connected to the semiconductor device; generating, with a control circuit (10) of the semiconductor device and in a first mode of operation, a drive signal ($V_G$) for a pass element ($T_L$) dependent on parameters of a first parameter set (PAR1) and based on data received via the communication interface (13); the pass element ($T_L$) being included in or coupled to the semiconductor device; and generating, with the control circuit (10) and in a second mode of operation, the drive signal ($V_G$) dependent on parameters of a second parameter set (PAR2) while discarding data received via the communication interface (13).

It is noted that the functions provided by the electronic switch and particularly by the control circuit described herein may be implemented in various ways. For example, the control circuit 10 (see FIGS. 1-4) may include a finite state machine for implementing the different modes of operation. As a skilled person will know, there are various suitable ways of implementing finite state machines and supplementary circuitry used in the control circuit 10 and the implementation details are not further discussed herein. Furthermore, it is understood that a skilled person will be able to combine and/or modify technical features described herein in connection with specific embodiments to create further embodiments.

The invention claimed is:

1. A circuit for controlling electrical power comprising:
a circuit node operably connected to a pass element configured to be switched on and off in accordance with a drive signal applied at the circuit node;
a communication interface configured to receive data from an external controller operably connected to the communication interface; and
a control circuit comprising a non-volatile memory configured to store a first parameter set and a second parameter, wherein the control circuit is configured to:
generate, in a first mode of operation, the drive signal dependent on parameters of the first parameter set and based on data received via the communication interface indicating switch-on and switch-off commands; and
generate, in a second mode of operation, the drive signal dependent on parameters of the second parameter set while discarding data received via the communication interface indicating switch-on and switch-off commands, wherein the first parameter set and the second parameter set comprise one or more of an over-voltage-threshold, an under-voltage threshold, an over-current threshold, an over-temperature threshold, or a parameter representing a desired slew rate and wherein a first parameter of the first parameter set comprises a different value than a second parameter of the second parameter set that corresponds to the first parameter.

2. The circuit of claim 1,
wherein the control circuit is configured to change from the first mode of operation to the second mode of operation in response to at least one of the following:
detecting a mode switch signal at a first input pin indicating a mode switch into the second mode of operation; or
the communication interface detecting received data as being corrupted.

3. The circuit of claim 2,
wherein the control circuit is configured to change from the second mode of operation back to the first mode of operation in response to both:
receiving data via the communication interface including a mode switch command; and
detecting a mode switch signal at the first input pin of the circuit indicating a mode switch into the first mode of operation.

4. The circuit of claim 1, further comprising:
a timer configured to measure an amount of time the circuit operates in the second mode of operation.

5. The circuit of claim 4,
wherein the control circuit is configured to change from the second mode of operation to the third mode of operation in response to the timer indicating that a predefined time span has lapsed since entering the second mode of operation, and
wherein the control circuit is further configured to generate the drive signal with a level suitable to switch the pass element into a non-conductive state when changing to the third mode of operation.

6. The circuit of claim 1,
wherein the control circuit is configured to change from the second mode of operation to a third mode of operation in response to receiving, from an external device, a further mode switch signal indicating a mode switch into the third mode of operation; and wherein the control circuit is further configured to generate the drive signal with a level suitable to switch the pass element off when changing to the third mode of operation.

7. The circuit of claim 6, wherein the further mode switch signal is received at a second input pin of the circuit.

8. The circuit of claim 1,
wherein the control circuit includes a volatile memory including a currently used parameter set, and
wherein the control circuit is configured to check whether the parameter set stored in the volatile memory is consistent with a corresponding parameter set stored in the non-volatile memory and to correct the parameter set stored in the volatile memory when an inconsistency is detected.

9. A circuit for controlling electrical power comprising:
a circuit node operably connected to a pass element configured to be switched on and off in accordance with a drive signal applied at the circuit node;
a communication interface configured to receive data from an external controller operably connected to the communication interface;
a control circuit configured to:
   generate, in a first mode of operation, the drive signal dependent on parameters of a first parameter set and based on data received via the communication interface indicating switch-on and switch-off commands; and
   generate, in a second mode of operation, the drive signal dependent on parameters of a second parameter set while discarding data received via the communication interface indicating switch-on and switch-off commands, wherein the first parameter set and the second parameter set comprise one or more of an over-voltage-threshold, an under-voltage threshold, an over-current threshold, an over-temperature threshold, or a parameter representing a desired slew rate and wherein a first parameter of the first parameter set comprises a different value than a second parameter of the second parameter set that corresponds to the first parameter; and
a watchdog circuit configured to surveil the external controller by requesting response from the external controller and receiving the requested response.

10. The circuit of claim 9, wherein the control circuit is further configured to change from the first mode of operation to the second mode of operation in response to the watchdog circuit signaling that the external controller is non-responsive.

11. A circuit for controlling electrical power comprising:
a circuit node operably connected to a pass element configured to be switched on and off in accordance with a drive signal applied at the circuit node;
a communication interface configured to receive data from an external controller operably connected to the communication interface; and
a control circuit configured to:
   generate, in a first mode of operation, the drive signal dependent on parameters of a first parameter set and based on data received via the communication interface indicating switch-on and switch-off commands; and
   generate, in a second mode of operation, the drive signal dependent on parameters of a second parameter set while discarding data received via the communication interface indicating switch-on and switch-off commands, wherein the first parameter set and the second parameter set comprise one or more of an over-voltage-threshold, an under-voltage threshold, an over-current threshold, an over-temperature threshold, or a parameter representing a desired slew rate and wherein a first parameter of the first parameter set comprises a different value than a second parameter of the second parameter set that corresponds to the first parameter; and
   communicate, via the communication interface to the external controller, a changeover to the second mode of operation.

12. A method comprising:
receiving data, using a communication interface of a semiconductor device and from an external controller operably connected to the semiconductor device;
generating, with a control circuit of the semiconductor device and in a first mode of operation, a drive signal for a pass element dependent on parameters of a first parameter set stored in non-volatile memory and based on data received via the communication interface indicating switch-on and switch-off commands;
the pass element being included in or coupled to the semiconductor device; and
generating, with the control circuit and in a second mode of operation, the drive signal dependent on parameters of a second parameter set stored in the non-volatile memory while discarding data received via the communication interface indicating switch-on and switch-off commands, wherein the first parameter set and the second parameter set comprise one or more of an over-voltage-threshold, an under-voltage threshold, an over-current threshold, an over-temperature threshold, or a parameter representing a desired slew rate and wherein a first parameter of the first parameter set comprises a different value than a second parameter of the second parameter set that corresponds to the first parameter.

13. A system comprising:
an external controller;
a circuit node operably connected to a pass element configured to be switched on and off in accordance with a drive signal applied at the circuit node;
a communication interface configured to receive data from the external controller operably connected to the communication interface; and
a control circuit comprising a non-volatile memory configured to store a first parameter set and a second parameter, wherein the control circuit is configured to:
generate, in a first mode of operation, the drive signal dependent on parameters of the first parameter set and based on data received via the communication interface indicating switch-on and switch-off commands; and
generate, in a second mode of operation, the drive signal dependent on parameters of the second parameter set while discarding data received via the communication interface indicating switch-on and switch-off commands,
wherein the first parameter set and the second parameter set comprise one or more of an over-voltage-threshold, an under-voltage threshold, an over-current threshold, an over-temperature threshold, or a parameter representing a desired slew rate, and
wherein a first parameter of the first parameter set comprises a different value than a second parameter of the second parameter set that corresponds to the first parameter.

14. The system of claim 13, further comprising a watchdog circuit configured to surveil the external controller by requesting response from the external controller and receiving the requested response.

15. The system of claim 13, wherein the control circuit is configured to communicate, via the communication interface to the external controller, a changeover to the second mode of operation.

* * * * *